United States Patent [19]
Davis et al.

[11] Patent Number: 5,640,691
[45] Date of Patent: Jun. 17, 1997

[54] POWER CONTROLLER FOR RF TRANSMITTERS

[75] Inventors: Paul Cooper Davis, Muhlenberg Township, Berks County; Brian K. Horton, Shillington, both of Pa.

[73] Assignee: Lucent Technologies Inc., Murray Hill, N.J.

[21] Appl. No.: 359,308

[22] Filed: Dec. 19, 1994

[51] Int. Cl.$^6$ ...................................................... H04B 1/04
[52] U.S. Cl. ........................ 455/126; 455/115; 455/127; 330/279
[58] Field of Search .................... 455/95, 115, 116, 455/126, 127, 129; 375/297, 312; 330/127, 279

[56] References Cited

U.S. PATENT DOCUMENTS

| | | | |
|---|---|---|---|
| 4,602,218 | 7/1986 | Vilmur et al. | 330/279 |
| 4,983,981 | 1/1991 | Feldman | 455/115 |
| 5,126,686 | 6/1992 | Tam | 330/134 |
| 5,179,353 | 1/1993 | Miyake | 455/126 |
| 5,204,973 | 4/1993 | Sugayama | 455/311 |
| 5,214,393 | 5/1993 | Aihara | 45/126 |
| 5,311,143 | 5/1994 | Soliday | 330/127 |
| 5,376,895 | 12/1994 | Aihara | 455/126 |
| 5,432,473 | 7/1995 | Mattila et al. | 455/126 |
| 5,438,683 | 8/1995 | Durtler et al. | 455/116 |

FOREIGN PATENT DOCUMENTS

| | | |
|---|---|---|
| 484139A1 | 5/1992 | European Pat. Off. . |
| 549479A1 | 6/1993 | European Pat. Off. . |

OTHER PUBLICATIONS

N. Scheinberg et al., 8107 IEEE Journal of Solid-State Circuits, Feb. 29, 1994, No. 2, pp. 151–154, "A Monolithic GaAs Low Power L-Band Successive Detection Logarithmic Amplifier".

European Search Report, Mar. 20, 1996.

*Primary Examiner*—Edward F. Urban

[57] ABSTRACT

The present invention provides an RF transmitter network for cellular telephone systems. The network includes power amplifier circuitry which coupled to a closed loop control system to provide a controllable RF amplitude envelope for the output power of the amplifier circuitry over a dynamic range of between about 5 milliwatts and about 3200 milliwatts.

11 Claims, 4 Drawing Sheets

POWER CONTROLLER FOR RF TRANSMITTERS

BACKGROUND

1. Technical Field

The present invention relates to power detectors used to control the output power of RF transmitters. More particularly, the present invention relates to a power detector having a wide dynamic range which is used as a transmit power detector in a feedback loop to control the output power of RF transmitters.

2. Description of the Related Art

In second generation cellular radio telephone systems, e.g., time division multiple access (TDMA) systems, speech is encoded by a base station or mobile station into a digital format for transmission to a mobile station or base station respectively. In a TDMA system, for example, only one carrier is required to permit "N" users to access the assigned bandwidth for the carrier on a time basis. In TDMA systems, a framing structure is used to transmit user data in frames having a predetermined duration (T seconds). Each frame is defined by a predetermined number of slots (N) which corresponds to the number of users. Thus, each user is assigned a slot in the frame to transmit data. Such framing structure permits each user to gain access to the carrier for approximately 1/N of the time and generally in an ordered sequence. If a user generates continuous data at a rate of "R" bits/sec., the data must be transmitted in a burst at a higher rate, e.g., NxR, during each frame transmission. Thus, the data is transmitted in such digital systems in short bursts for short periods of time.

To transmit such short bursts of data, the RF transmitters in the mobile station are switched "on" for approximately 0.6 ms and switched "off" for the remainder of the data frame, e.g., 4 ms. Typically, if the switching characteristics of the transmitter are not within predefined parameters, the shape of the amplitude envelope of the transmitted data may vary. In certain cellular radio systems, the power level and amplitude envelope of the transmitted signal are specified by regulatory agencies. Typically, the base station transfers information to the mobile station which instructs the mobile station to transmit data at a particular power level within a predefined tolerance level established by such regulatory agencies. The desired dynamic range of such a communication system is between about 5 milliwatts and 3200 milliwatts. Variations from the required power level and the required amplitude envelope at any point along the wide dynamic range will affect the integrity of the system with respect to such regulatory agencies. To avoid variations in the amplitude envelope, the shape of the amplitude envelope must be precisely controlled particularly at the leading and trailing edges of the burst, i.e., at the rise and fall ramps of the burst. Precise control of the amplitude envelope at the leading and trailing edges of the burst is necessary, especially at transmitter switching times of approximately 10 to 30 microseconds. To achieve such precisely controlled amplitude envelopes, power detectors have been utilized in the transmit power network of the transmitter to control the amplitude envelope of the output RF signal.

One currently used technique for controlling the amplitude envelope is a conventional diode detector scheme in a feedback loop. However, utilization of the diode detector in the feedback loop causes the controllability of the power level to be reduced as the transmitter power level is reduced. Utilizing the diode detector scheme, the amplitude envelope of the output RF signal is adequately controlled at high power levels. However, at low power levels the amplitude envelope of the output RF signal cannot be adequately controlled. As a result, the dynamic range of current second generation cellular networks is limited by the characteristics of the diode detector.

Therefore, a need exists for a power detector network which provides a precisely controlled amplitude envelope of the output RF signal of the transmitter over the wide dynamic range of cellular communication systems. That is, a need exists for a power detector network which precisely controls the amplitude envelope of the output RF signal at low output power levels as well as high output power levels.

SUMMARY OF THE INVENTION

The present invention relates to an RF transmitter network for cellular telephone systems. The transmitter network includes power amplifier circuitry coupled to a closed loop control system to provide a precisely controlled RF amplitude envelope for the output power of the amplifier circuitry over a dynamic range of between about 5 milliwatts and about 3200 milliwatts. Thus, the power ratio for such transmitter networks is 640 to 1.

In particular, the RF transmitter network includes a programmable attenuator, a power amplifier circuit having an input connected to the attenuator and an output connected to an RF signal divider. The transmitter network also includes signal strength indicator circuitry having an input operatively coupled to an output of the RF signal divider, and signal comparing means having a first input coupled to an output of the signal strength indicator circuitry and a second input connectable to a control signal. In this configuration a difference between signals on the first and second inputs programs the programmable attenuator so as to control the amplitude of the RF signal passing through said attenuator.

Preferably, the signal strength indicator circuitry includes a plurality of cascaded amplifiers, a plurality of corresponding diode detectors coupled to outputs of the cascaded amplifiers such that one diode is coupled to one amplifier output and means coupled to the plurality of diode detectors for summing the outputs of the detectors.

BRIEF DESCRIPTION OF THE DRAWINGS

Preferred embodiments of the invention are described hereinbelow with reference to the drawings wherein.

DETAILED DESCRIPTION

The transmitter network of the present invention may be a compilation of individual components connected by suitable cabling. Preferably, the transmitter network is a single integrated component fabricated and packaged using GaAs and/or silicon integrated circuit technology.

Figure 1:
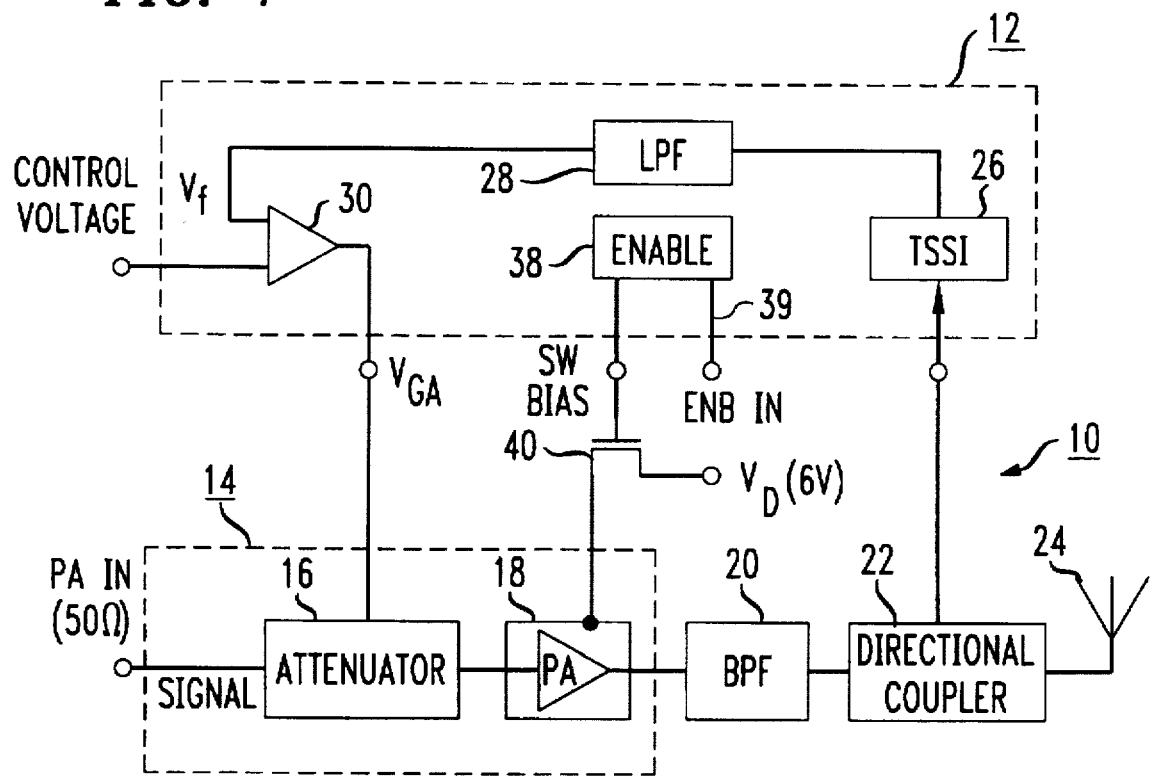
FIG. 1 is a block diagram of a transmitter network used in cellular radio transmitters, incorporating a transmitter signal strength indicator circuit in a closed loop control system of the transmitter network.

Referring to FIG. 1, a transmitter network 10 (or transmitter portion of a radio) of a cellular radio telephone system is shown. The transmitter network incorporates a power detector network 12 in a closed loop control system arrangement, which stabilizes the amplitude envelope of the output RF signal from the transmitter network. Typically, the output power of the transmitter network 10 ranges between about 5 dBm and about 33 dBm. The the input power to the power amplifier network 14 may be arbitrary. The allowed variation in the output power of the transmitter network depends on the dynamic range of the attenuator. Typically, the input power to the attenuator is between about −3 dBm and about +3 dBm, and is preferably 0 dBm.

As shown in FIG. 1, the transmitter network 10 includes the power amplifier network 14 coupled to the power detector network 12. The power amplifier network 14 includes a voltage controlled attenuator 16 having two inputs, a control input and a signal input. The output of the voltage controlled attenuator is connected to a power amplifier 18. The power amplifier 18 is preferably a cascaded amplifier network which provides a fixed gain of about 40 dB. Typically, the cascaded amplifier network is a three staged circuit, wherein each stage has fixed bias voltages to provide the fixed gain output.

Continuing to refer to FIG. 1, the output RF signal of the power amplifier 18 is filtered by band-pass filter 20 and coupled to a directional coupler 22 prior to broadcasting via antenna 24. The attenuated RF signal from the secondary port of the directional coupler 22 is coupled to a transmit signal strength indicator (TSSI) network 26 associated with the power detector network 12. The TSSI network 26 is a pseudo-logarithmic amplitude demodulator which down-converts the RF frequency, e.g., 900 MHz, and generates a low frequency output signal proportional to the amplitude expressed in dBm of the input RF signal. An example of a similar signal strength indicator network is the model ATTW 2005 manufactured by AT&T, which operates at a frequency of about 0.5 MHz.

Figure 2:
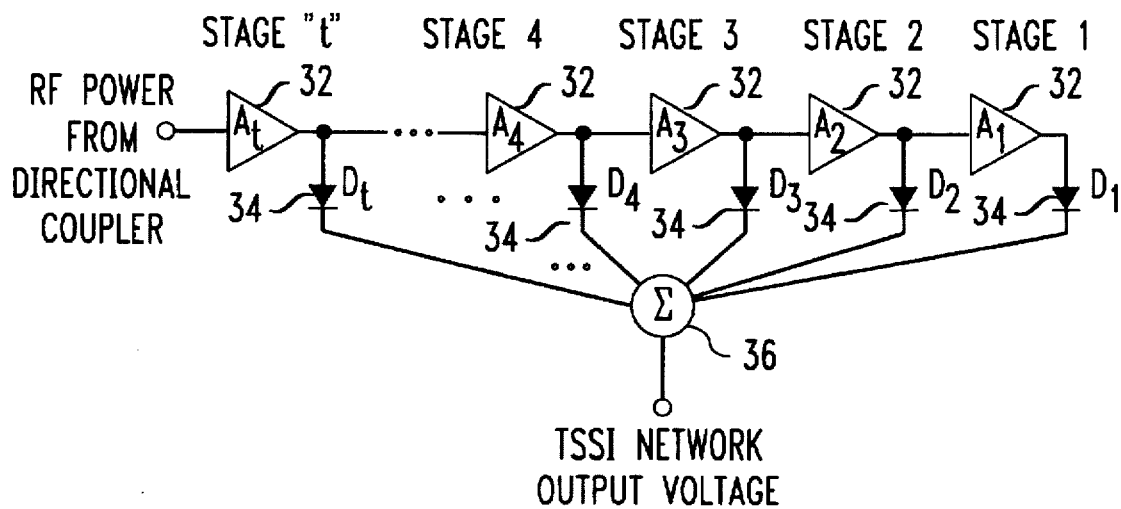
FIG. 2 is a block diagram of the transmitter signal strength indicator network shown in FIG. 1.
Figure 3:
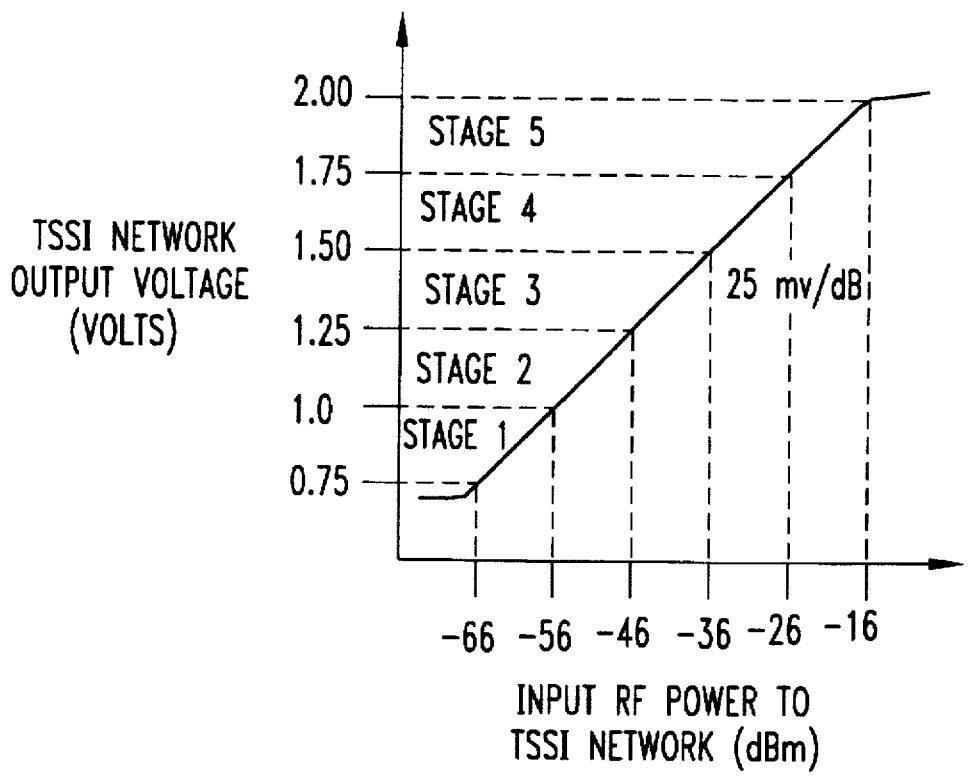
FIG. 3 illustrates the transfer function of the transmitter signal strength indicator of the present invention.

Referring to FIG. 2, a block diagram of the TSSI network 26 is shown. The TSSI network 26 includes a plurality of cascaded amplifiers 32 and corresponding diode detectors 34 which define stages, e.g., stages 1 through t. Each amplifier preferably has a gain of about 10 dB and each stage has a dynamic range of about 0–300 mV. When the power amplifier 18 is turned on by the enable circuit 38, as will be described below, the input power to the TSSI network increases causing each stage in the TSSI network to amplify the signal. As the input power to the TSSI network increases to the point where the amplifier of a stage, e.g., stage 1, exceeds the dynamic range, the output power from the stage amplifier remains substantially constant. If the input power to the TSSI network continues to increase, the next in line stage, e.g., stage 2, continues to increase the output power of the corresponding stage amplifier. If the next in line stage (e.g., stage 2) reaches the dynamic range limit of the stage amplifier, then the output power of that stage amplifier remains substantially constant. This process continues for each stage in the TSSI network 26 as each stage reaches the dynamic range of the stage amplifier. Thus, each stage is substantially linear over the dynamic range and the combination of the stages provides "t" times 300 mV of total dynamic range, where "t" is the total number of stages. FIG. 3 illustrates the transfer characteristics of the TSSI network 26.

As described above, the output of each stage amplifier 32 is connected to a corresponding diode detector 34. The diode detector provides a D.C. output voltage which is proportional to the RF amplitude. The output of each diode detector 34 is connected to summing circuit 36. The output of the summing circuit 36 provides a piecewise linear approximation of a logarithmic detector. In this configuration, the output of the TSSI network 26 is a pseudo-linear voltage which is proportional to the input RF power measured in decibels (dB). In addition, the relationship between the change in input power, measured in decibels, to the TSSI network and the voltage output of the TSSI network is constant over the dynamic range of the transmitter. Preferably, the relationship is 25 mV of output voltage for every 1 dB change in the input RF power, as shown in FIG. 3.

Figure 4:
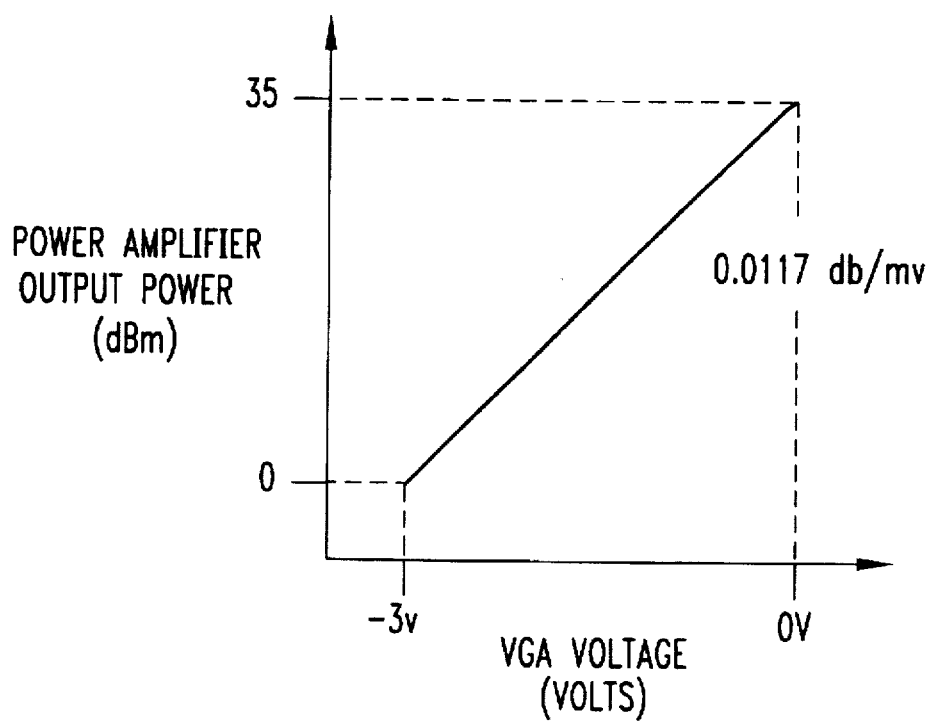
FIG. 4 illustrates the transfer function of the power amplifier network of the present invention.

Returning to FIG. 1, the output voltage of the TSSI network 26 is filtered by low-pass filter 28. The output of filter 28 is coupled to one input terminal of differential amplifier (or comparator) 30. Preferably the differential amplifier is a high gain amplifier having a gain of about 1000. The other input terminal of differential amplifier 30 is coupled to a control voltage dependent on information provided by the base station. The output of the differential amplifier 30 is coupled to the attenuator 16 of the power amplifier network amplifier 14 and is provided to control the amplitude of the output power so as to generate a stable RF amplitude envelope. FIG. 4 illustrates the relationship of the output power of the power amplifier 18 verses the output voltage ($V_{GA}$) Of differential amplifier 30.

Figure 5:
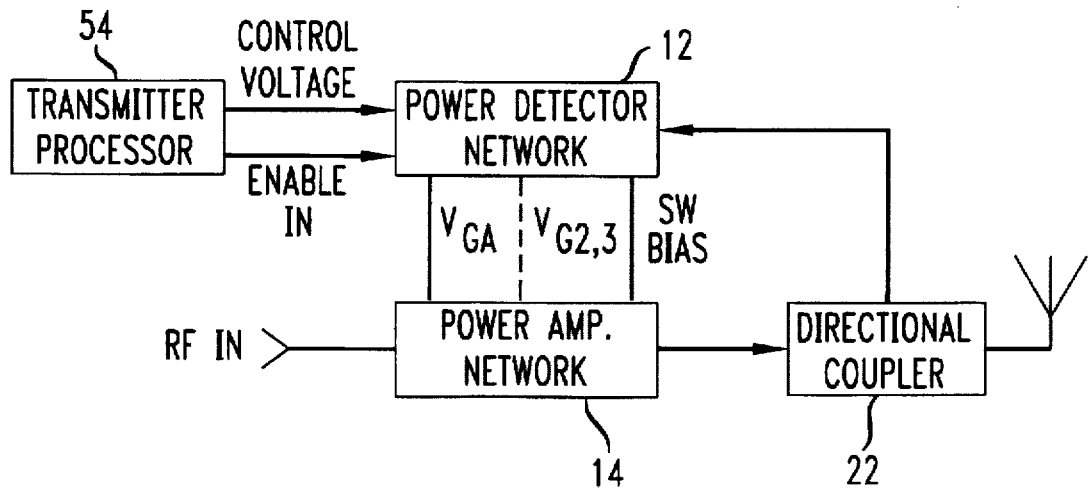
FIG. 5 illustrates an exemplary system configuration incorporating the transmitter network of the present invention.

Preferably, the control voltage is generated by a transmitter processor, shown in FIG. 5, within the mobile station. Typically, the transmitter processor 54 includes a processor, memory including programmable memory, such as an EEPROM, and stored programs, e.g., system and application, which control the operation of the transmitter processor. An example of a suitable transmitter processor is the model CSP 1088 manufactured by AT&T. The programmable memory is provided to store predefined control voltages associated with the operating RF power levels of the transmitter network. The predefined control voltages define the amount of attenuation of the RF power necessary to maintain a stable amplitude envelope and may be calculated for ideal conditions. However, processing variations between the various components in the transmitter network 10 may destabilize the amplitude envelope. Thus, the predefined control voltages are preferably determined by measuring the output RF power of the transmitter network 10 after manufacture and then determining the necessary control voltage to maintain a stable amplitude envelope for the RF output power of the transmitter network 10. Once the control voltages are determined for the various power levels of the transmitter network, the values are programmed into the programmable memory of the transmitter processor. Since the control voltage should track the TSSI output voltage, preferably the control voltage ranges from between about 0.75 volts and about 2 volts, as shown in FIG. 3 and described above.

The stability of the closed loop can be determined by considering the transfer function characteristics of the TSSI network 26 and the transfer function characteristics of the difference amplifier 30. To ensure a stable closed loop, the differential amplifier is a unity gain stable operational amplifier with an $F_T$ of 1 MHz. In addition, the closed loop configuration described herein has low frequency gain between the attenuator control voltage input ($V_{GA}$) and the TSSI network output voltage. This provides a closed loop which has about 85° of phase margin and a time constant of less than 1 μsec.

As noted above, in digital cellular systems data is transmitted in frames and each user is assigned a slot in the frame. Depending on the type of system standard the cellular system is designed in accordance with, e.g., the GSM standard or the IS54 standard, each frame has a predefined number of slots as defined by the standard and each user transmits data for a fraction of the frame period. For example, in the GSM standard each frame has 8 slots and each user transmits data for ⅛ of the transmit time. As a result, the power amplifier 18 in the transmitter network 10 only needs to be on during the transmit time for the user, e.g., for ⅛ of the time of the frame. Enable circuit 38 in combination with switch 40, controls the operation of power amplifier 18 so as to turn the power amplifier on during the time to transmit and then turning the power amplifier off. The "enable in" line 39 of enable circuit 38 is coupled to a timing circuit, e.g., the TDMA timer circuitry, in the base or mobile station to synchronize the operation of the power amplifier 18 with the transmission of data.

In operation, an input RF signal having an arbitrary, non-zero amplitude is applied to the RF input of the attenuator 16. A control voltage associated with the desired output from the antenna is applied to the differential amplifier 30 by the transmitter processor in either the base station or the mobile station. The output voltage of differential amplifier 30 is proportional to the voltage difference between the control voltage and the output voltage ($V_p$) from the TSSI network 26. The output voltage of the differential amplifier ($V_{GA}$) may range from between about −3 volts and about 0 volts. The relationship between the control voltage and the output power of the attenuator 16 is shown in FIG. 4. As shown, the RF output power ranges between about 0 dB at a control voltage of about −3 volts, and about 35 dB at a control voltage of about 0 volts. The output of attenuator 16 is amplified by power amplifier 18. The output RF power of the power amplifier is fixed by the control system to a value such that the TSSI network output is equal to the control voltage.

Figure 6:
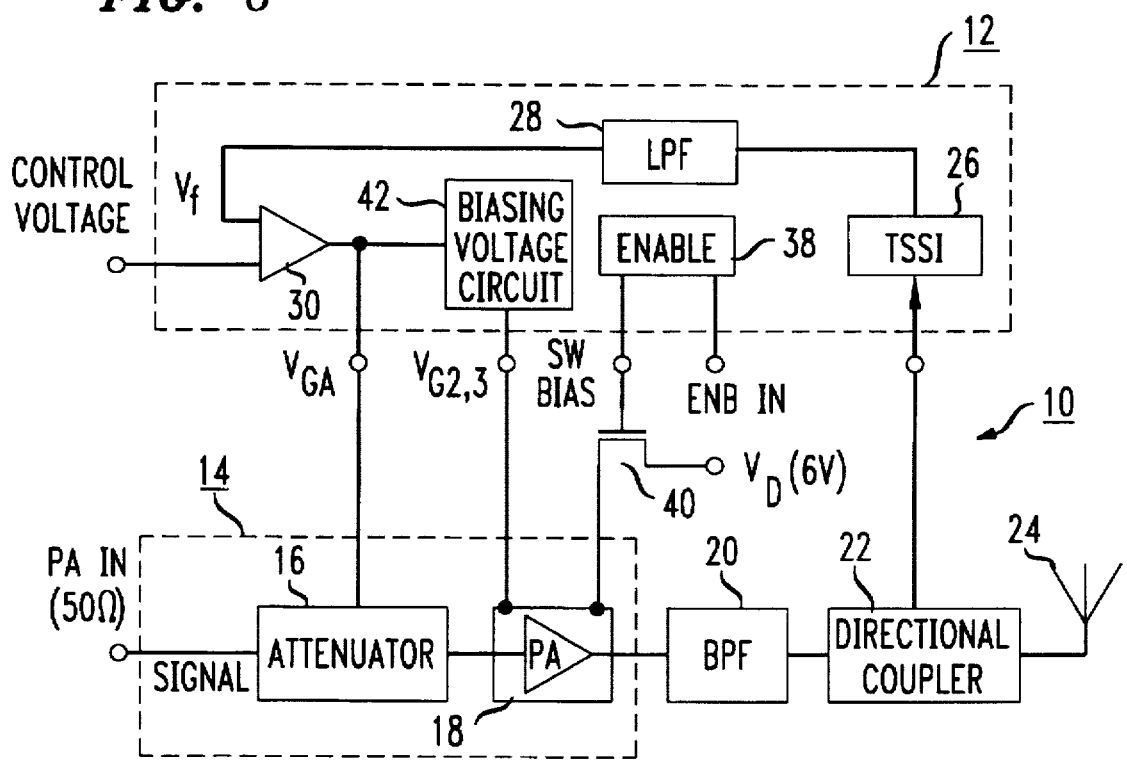
FIG. 6 illustrates an alternative embodiment of the transmitter network incorporating a biasing voltage circuit.
Figure 7:
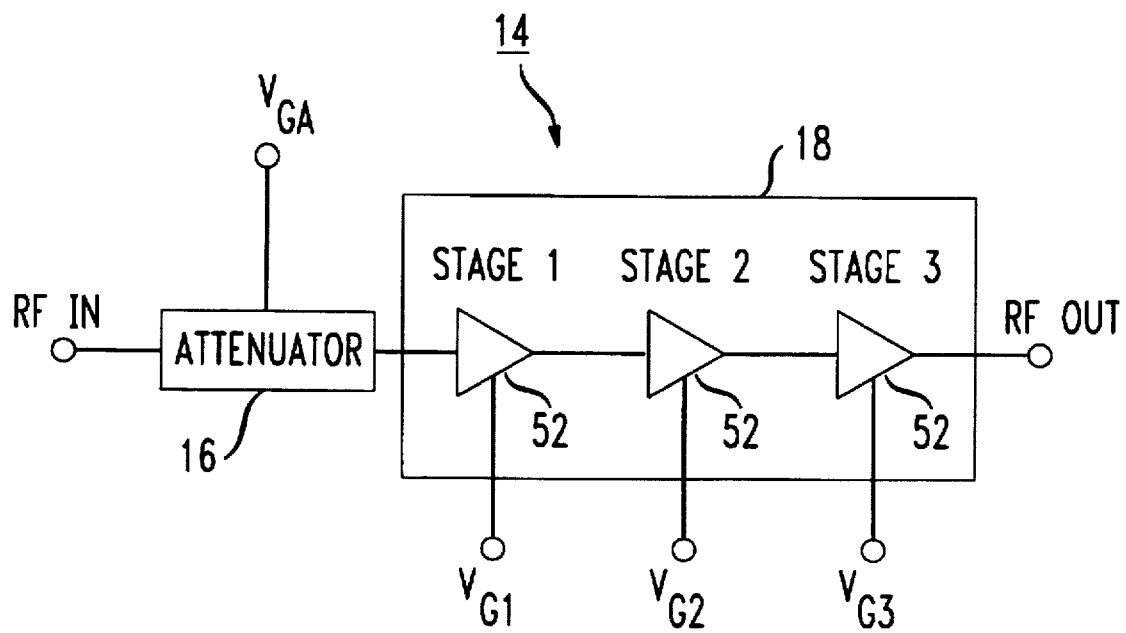
FIG. 7 illustrates a three stage power amplifier circuit.

FIGS. 6 and 7 illustrate an alternative embodiment of the transmitter network. In this alternative embodiment, a biasing voltage circuit 42 is coupled to the power amplifier 18 and generates biasing voltages to optimize the operation of the power amplifier, while minimizing the power consumed by the amplifier. To illustrate, the power amplifier is preferably a cascade of amplifiers 52 each having a fixed gain. Thus, as attenuator 16 increases the attenuation of the RF signal, the input and output power of the power amplifier is decreased. If the bias voltage remains constant, the efficiency of the power amplifier is reduced in proportion to the reduction in magnitude of the output power of the attenuator 16. The decrease in efficiency occurs because the output stages of the power amplifier, e.g., stages 2 and/or 3 shown in FIG. 7, consume a substantial portion of the biasing voltage in order to provide the desired gain. For example, if each amplifier stage in the power amplifier has a 10 dB gain, the output stage (stage 3) will consume 10 times more biasing power than the input stage (stage 1).

To maximize the efficiency of the power amplifier 18, the biasing voltage for each amplifier stage of the power amplifier is controlled by a biasing voltage which is preferably responsive to the attenuator 16 control voltage ($V_{GA}$). However, the biasing voltage may also be fixed or may be independently controlled by a separate voltage controller.

While the invention has been particularly shown and described with reference to certain preferred embodiments, it will be understood by those skilled in the art that various modifications in form and detail may be made therein without departing from the scope and spirit of the invention. Accordingly, modification to the preferred embodiments will be readily apparent to those skilled in the art, and the generic principles defined herein may be applied to other embodiments applications without departing from the spirit and scope of the invention. Thus, the present invention is not intended to be limited to the embodiments shown, but it is to be accorded the widest scope consistent with the principles and features disclosed herein.

What is claimed is:

1. An RF transmitter network for cellular telephone systems, which comprises:

a voltage controlled attenuator;

a power amplifier circuit having an input connected to said attenuator and an output coupled to an RF signal divider;

signal strength indicator circuitry having an input operatively coupled to an output of said RF signal divider, said signal indicator circuitry comprising a plurality of cascaded amplifiers, a plurality of corresponding diode detectors coupled to outputs of said cascaded amplifiers such that one diode detector is coupled to one amplifier output, and means coupled to said plurality of diode detectors for summing the outputs of said detectors; and signal comparing means having a first input coupled to an output of said signal strength indicator circuitry and a second input connectable to receive a control signal, said signal comparing means providing an output control voltage in accordance with a difference between signals on said first and second inputs thereof, said output control voltage being applied to said attenuator so as to control the amplitude of the RF signal passing through said attenuator.

2. The RF transmitter network according to claim 1, wherein each said cascaded amplifier has a gain of 10 dB.

3. The RF transmitter network according to claim 1, wherein said signal comparing means comprises a differential amplifier.

4. The RF transmitter network according to claim 1, wherein said power amplifier circuit includes a cascade of power amplifiers.

5. The RF transmitter network according to claim 1, wherein said wireless telephone system comprises a cellular telephone system.

6. The RF transmitter network according to claim 1, wherein a controlled RF amplitude envelope is provided over a dynamic range of between about 5 milliwatts and about 3200 milliwatts.

7. An RF transmitter for use in a wireless communication system, comprising:

a voltage controlled attenuator;

a power amplifier circuit having an input coupled to said attenuator and an output coupled to an RF signal divider;

signal strength indicator circuitry having an input operatively coupled to an output of said RF signal divider;

a comparator having a first input port coupled to an output of said signal strength indicator circuitry, and a second input port connected to receive an input control signal, said comparator providing an output control voltage in accordance with a difference between signals on said first and second input ports, said output control voltage being applied to said attenuator to control amplitude of an RF signal passing therethrough, thereby controlling input RF power to said power amplifier circuit; and a biasing voltage circuit connected to receive said output control voltage of said comparator and operable to control at least one bias voltage supplied to said power amplifier circuit responsive to said control voltage, to thereby control power consumption within said power amplifier circuit.

8. The RF transmitter network according to claim 7 further comprising an antenna coupled to said power amplifier circuitry.

9. The RF transmitter network according to claim 7, wherein said signal strength indicator circuitry comprises:

a plurality of cascaded amplifiers;

a plurality of corresponding diode detectors coupled to outputs of said cascaded amplifiers such that each said diode is coupled to one amplifier output; and means coupled to said plurality of diode detectors for summing the outputs of said detectors.

10. The RF transmitter according to claim 7, wherein said wireless communication system comprises a cellular telephone system.

11. A method for controlling the amplitude envelope of an RF transmitter, comprising:

directing a portion of an output RF signal of the RF transmitter to a closed loop control system;

amplifying said directed portion of said output RF signal in said closed loop control system to provide a substantially linear voltage as a function of amplitude change of said output RF signal using a plurality of cascaded amplifiers, a plurality of corresponding diode detectors coupled to outputs of said cascaded amplifiers such that each one of said diode detectors is coupled to one associated amplifier output, and means coupled to said plurality of diode detectors for summing the outputs of said detectors to provide said linear voltage;

comparing said linear voltage with a variable control voltage; and adjusting the amplitude of said output RF signal until said linear voltage equals said variable control voltage.

* * * * *